(12) United States Patent
Peng et al.

(10) Patent No.: US 6,791,083 B2
(45) Date of Patent: Sep. 14, 2004

(54) IMAGE COMPENSATION DEVICE FOR A SCANNING ELECTRON MICROSCOPE

(75) Inventors: Kevin Chan Ee Peng, Singapore (SG); Yelehanka Ramachandramurthy Pradeep, Singapore (SG); Chua Thow Phock, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/207,551

(22) Filed: Jul. 29, 2002

(65) Prior Publication Data

US 2004/0016881 A1 Jan. 29, 2004

(51) Int. Cl.$^7$ .......................... G01N 23/00; G21K 7/00; H01J 37/28
(52) U.S. Cl. ........................... 250/310; 250/307
(58) Field of Search ................. 250/307, 310, 250/492.2, 441.11

(56) References Cited

U.S. PATENT DOCUMENTS

| | | | |
|---|---|---|---|
| 4,907,287 A | | 3/1990 | Homma et al. ............... 382/54 |
| 4,945,246 A | * | 7/1990 | Davis et al. .............. 250/492.2 |
| 5,229,607 A | | 7/1993 | Matsui et al. ............... 250/306 |
| 5,254,856 A | * | 10/1993 | Matsui et al. ............... 250/310 |
| 5,442,183 A | * | 8/1995 | Matsui et al. ........... 250/441.11 |
| 5,591,971 A | | 1/1997 | Shahar et al. ............... 250/310 |
| 6,043,491 A | | 3/2000 | Ose et al. .................... 250/310 |
| 6,521,891 B1 | * | 2/2003 | Dotan et al. ................ 250/310 |
| 6,541,771 B2 | * | 4/2003 | Iwabuchi et al. ........... 250/310 |
| 6,555,816 B1 | * | 4/2003 | Sawahata et al. .......... 250/310 |

* cited by examiner

*Primary Examiner*—Nikita Wells
*Assistant Examiner*—Johnnie L Smith, II
(74) *Attorney, Agent, or Firm*—George O. Saile; Rosemary L. S. Pike

(57) ABSTRACT

An apparatus for preventing distortion to critical dimension line images formed by a SEM under the influence of external electro-magnetic emissions generating by neighboring manufacturing equipment. The external emission causes a high three sigma A/C component. The correcting apparatus includes an external shielding coil mounted to the column housing of the SEM. A control electro-emission driver is mounted to the external shielding coil in which a variable voltage divider having a transformer with a variable resistor. The variable resistor is adjusted varying the amplitude of the sine wave of the A/C signal thus controlling the electro-emission driver while reducing the effects of the three sigma A/C component.

16 Claims, 3 Drawing Sheets

IMAGE COMPENSATION DEVICE FOR A SCANNING ELECTRON MICROSCOPE

BACKGROUND OF THE INVENTION (1) Technical Field

This invention relates to scanning electron microscopy and more particularly to producing image exactness during the measurement of critical dimensions pertaining to semiconductor structures.

(2) Description of the Prior Art

The following documents describes external shielding for an scanning electron microscope (hereinafter referred to as SEM)

U.S. Pat. No. 6,043,491 issued Mar. 28, 2000 to Yoichi Ose et al., uses external shielding for clearer SEM images by suppressing interferences.

U.S. Pat. No. 5,591,971 issued Jan. 7 1997 to Shahar et al., and U.S. Pat. No. 5,229,607 issued Jul. 20, 1993 to Matsui et al., show related patents describing an interposing mesh structure for preventing electrical field leakage during SEM imaging.

U.S. Pat. No. 4,907,287 issued Mar. 6, 1990 to Homma et al., describe a SEM that doesn't need extra shielding A scanning electron microscope (SEM) is widely used in the semiconductor industry for measurement at very high magnification, providing indisputable data for optimizing, for example, correctness of critical dimensions of structures being formed on semiconductor devices. In a SEM, a specimen is irradiated with a focused beam of electrons directed to scan a plane of the specimen. The analysis is done by moving the focused beam of electrons in a sweeping (raster) action over the plane of the specimen. Electrons are scattered from the sample as the beam traverses it, a process known as proximity effect, or back scattering, X-rays are also emitted as the electrons are precipitately stopped after hitting the sample. These interactions are well understood by those knowledgeable with the situation. The scattered and emitted electrons are collectively processed from suitable detectors, the output of which, are combined to provide a signal depicting the topography of the scanned sample. This signal is converted into an intensity modulated input into a CRT for display, thus obtaining a scanned image (SEM image) of the specimen for analysis.

Other methods for image correction which appear as superposed disturbances in a SEM image while under the influence of vibration is reduced by averaging the image data over a plurality of image frames, and further correcting image distortion produced under action of magnetic fields generated by power sources employed in peripheral equipment described in the referenced prior art. U.S. Pat. No. 4,907,287. However, competitive pressures in the semiconductor industry require manufacturers to achieve maximum throughput rates in their production lines.

The SEM is utilized for an observation or measurement of a submicron size feature formed in a wafer specimen for a semiconductor device. In such an application, it is required that the SEM allow measurement to be made with a <10 nm of resolution. Moreover, the SEM critical measurement must be automated, accurate, and fast Generally between 5 and 10 target locations on each semiconductor wafer are measured in this way. Measurement must be done at rates exceeding 25 wafers per hour or between 125 to 250 targets per hour, permitting 14 to 28 seconds per target. This includes wafer handling and alignment times.

The present invention concerns an image enhancement device which can be advantageously used for reducing distortions appearing in a scanned image. The distortions are influenced by an externally generated electro-magnetic emission signal from a component of alternating current. The enhancement is accomplished without a need for averaging image data over a plurality of image frames.

SUMMARY OF THE INVENTION

It is therefore an object of the present invention to eliminate the drawbacks of the prior art system described above, and provide an image enhancement device for a scanning electron microscope (SEM) that produces an output image of exactness and quality without averaging image data over a plurality of image frames.

It is another object of the present invention to improve on the image quality thereby ameliorating the 3-sigma uncertainty in the SEM image (line) measurement results.

In view of the above objects, it is proposed according to the present invention that distortion appearing on the image which is influenced by an externally generated electro magnetic emission signal be eliminated without added filtering algorithms or the like. More specifically, in accordance with the present invention, predictability and stability of the image quality are accomplished by mounting an image compensation device to the column housing of a scanning electron microscope, for example, an SEM which is used exclusively for measuring critical dimensions of a specimen. The image compensation device introduces a known electro-magnetic, 50 Hz. A/C component within the shielding coil of the SEM, therein, nullifying the effects of the externally generated electro magnetic emission, hence, producing a distortion free image quality.

DETAILED DESCRIPTION OF THE PREFERRED EMBODIMENT

Figure 1:
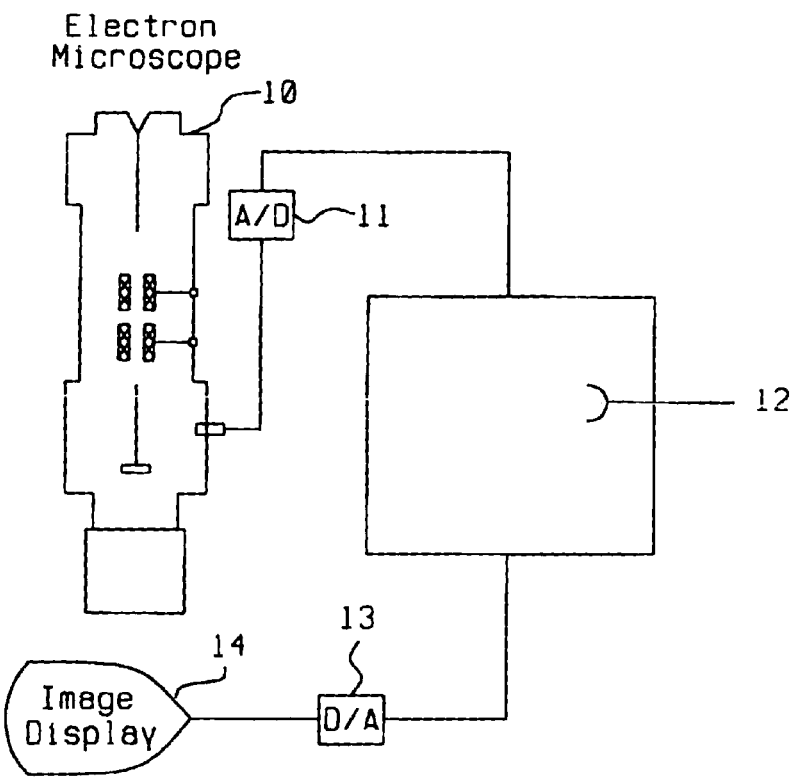
FIG. 1 schematically illustrates a cross section of a prior art scanning electron microscope.

FIG. 1 illustrates a schematic drawing of a prior-art scanning electron microscope. A scanned analog image signal obtained from a SEM 10 is converted to a digital signal by an A/D converter 11 and is subsequently processed via image enhancement algorithms 12 and converted back to an analog signal 13 thereon forming an image display 14 of a corrected image.

Figure 4:
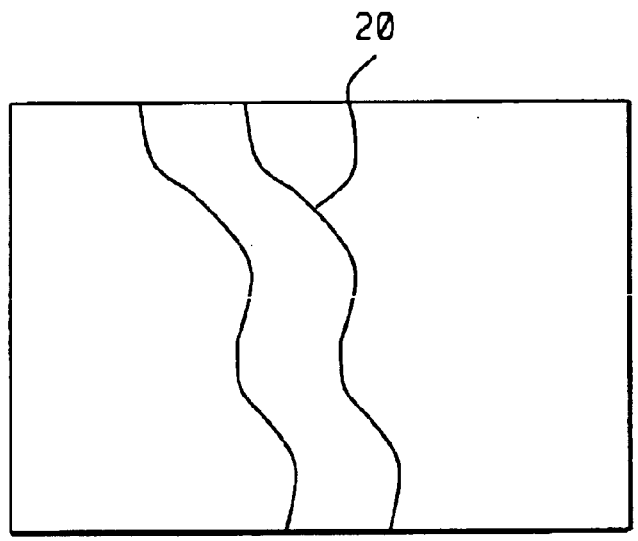
FIG. 4 is an illustration on a distorted image due to an electro-magnetic interference.

The invention is concerned with improvements to images produced by a scanning electron microscope. External electro-magnetic emissions proliferating from nearby equipment, within a manufacturing environment, cause distortions to images of circuit lines being measured, the results of which produce the resolution needed to verify its critical dimensions. These images of critical dimensions must have explicitness so that devices made from these structures will be ensured to operate correctly. FIG. 4 illustrates a distorted circuit line image 20 caused by the external electro-magnetic emissions.

Figure 2:
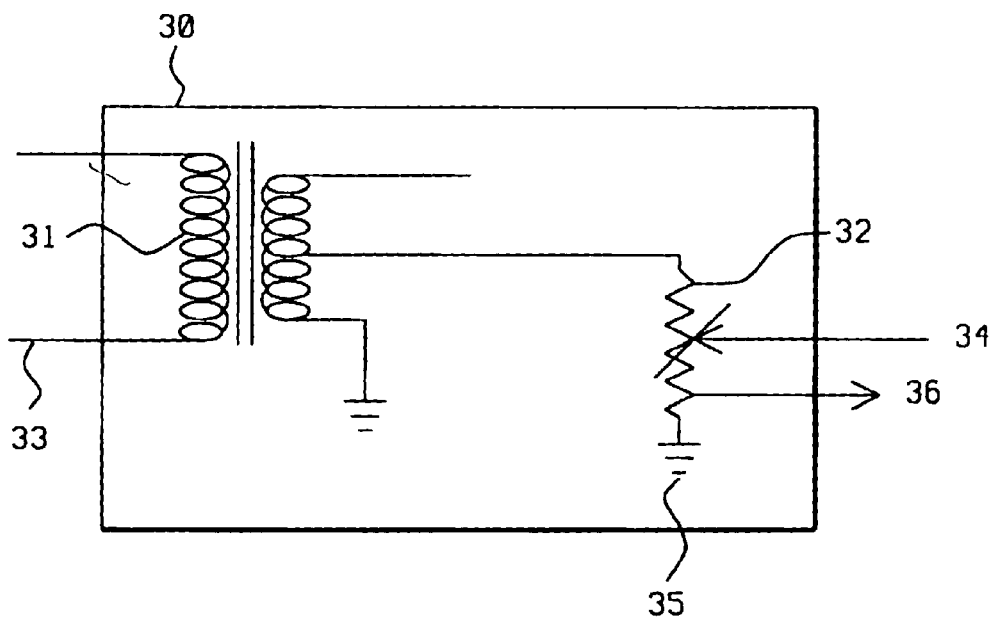
FIG. 2 illustrates a schematic of the electro-emission driver of the invention.
Figure 3:
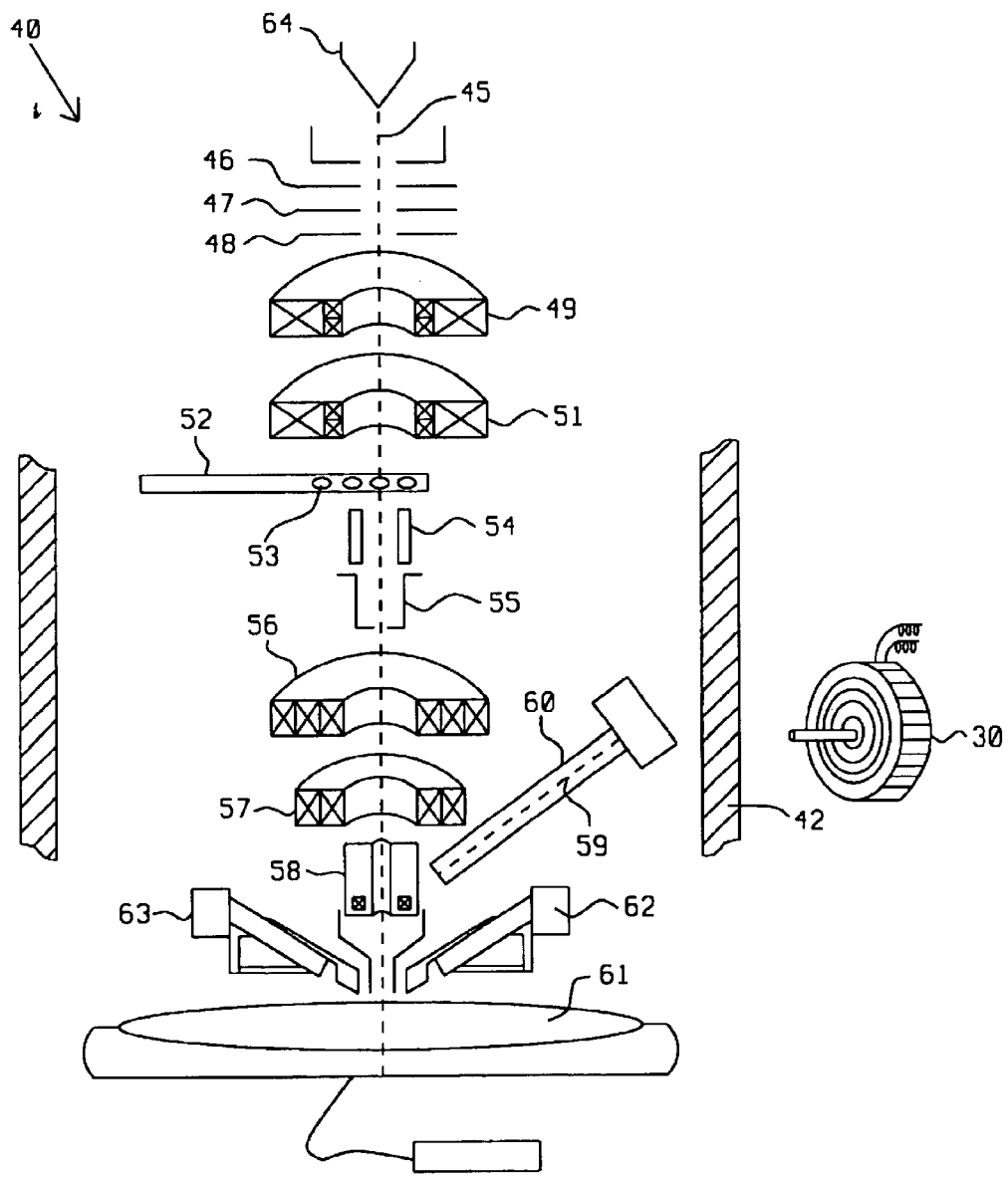
FIG. 3 shows the apparatus of the invention as installed on a scanning electron microscope.

Referring now to FIGS. 2 and 3. FIG. 2 illustrates a schematic of the variable voltage divider 30 which introduces a controlled electro-magnetic emission within a shielding column 42 of the SEM shown in FIG. 3. The variable voltage divider is externally mounted on the shielding column 42 of the SEM. 40 and feeds the column enclosure. The shielding column 42 is made from a nickel-iron alloy which has extremely high magnetic permeability at low field strengths. The shielding column 42 not only protects the charged particle beam from ambient disturbances but also provides external shielding to its internal volume with a low residual magnetic field (typically less than 5 milligaus). The variable voltage divider 30, in FIG. 2, is an electro-emission driver which includes a transformer 31 with a variable resistor 32 to adjust the A/C voltage 33 to an A/C output voltage 36. The adjusted amplitude of the sine wave of the output 34 and 35 feeds the shielding column 42. FIG. 3 shows the apparatus of the invention as installed oil a scanning electron microscope.

A brief description of the SEM optical components contained within the shielding column 42, starting at the top of FIG. 3, will be identified. The SEM optical components include a cathode 64 for producing an electron beam 45, a first anode 46, a second anode 47, and a third anode 48 for accelerating the beam of electrons, a first condensing lens 49 for converging the electrons which includes an upper alignment coil, referred to as a stigma coil. The lens 49 is followed with a second condensing lens 51. An objective aperture 52 with a plurality of aperture shapes 53 for reducing the beam's diameter is follow by blanking aperture 54 to reduce scattered electrons, a faraday cup 55 for probing electron flow, a deflection image shift lower alignment coil 56 followed by a low deflect low image shift coil 57. An E×B lens 58 is used to direct.

Figure 5:
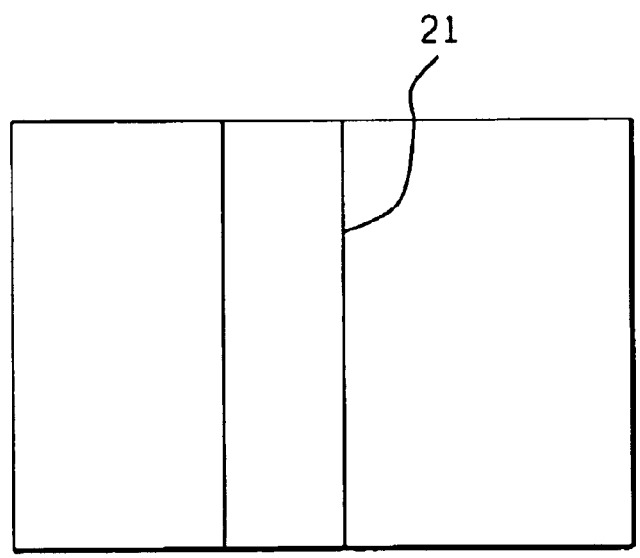
FIG. 5 is an illustration on a corrected image resulting from the use of a controlled electro-magnetic signal.

FIG. 5 is a comparison illustration to FIG. 4, showing the resulting image correction 21 of the distorted circuit line 20, as illustrated in FIG. 5., when the SEM is fed by a controlled electro-magnetic emission driver that suppresses the external noise generated by neighboring equipment.

While the invention has been particularly shown and described with reference to the preferred embodiments thereof, it will be understood by those skilled in the art that various changes in form and details may be made without departing from the spirit and scope of the invention.

What is claimed is:

1. An apparatus for preventing electro-magnetic interference from distorting images formed by a scanning electron microscope, said apparatus comprising:

means for producing a scanning electron beam and scanning a critical dimension imprinted on a semiconductor structure, said electron microscope is housed in a shielding column;

mounting a control electro-emission driver to said shielding column;

said control electro-emission driver is adjusted with a variable voltage divider to vary the amplitude of a sine wave of an alternating current.

2. The apparatus of claim 1 wherein a distorted image is caused by SEM sensitivity to external magnetic fields.

3. The apparatus of claim 2 where said external magnetic fields are produced by A/C powered equipment operating proximal said SEM.

4. The apparatus of claim 1 wherein said control electro-emission driver further comprising a transformer with a variable resistor for adjusting an input alternating current to a different output alternating current.

5. The apparatus of claim 4 wherein said output alternating current having an adjusted amplitude of the sine wave is fed into said shielding column.

6. The apparatus of claim 4 wherein said different output alternating current has a frequency of 50 Hz.

7. The apparatus of claim 5 wherein feeding said shielding column with a known A/C component corrects image distortions caused by said external electro-magnetic emissions.

8. The apparatus of claim 1 wherein said shielding column is a shield barrier composed of a nickel-iron alloy material which has extremely high magnetic permeability at low field strengths.

9. A method for preventing electro-magnetic interference from distorting images formed by a scanning electron microscope, comprising the steps of:

providing means for producing a scanning electron beam for scanning critical dimensions imprinted on a semiconductor structure, said scanning electon beam housed in a shielding column;

providing a semiconductor structure;

providing a control electro-emission driver and mounting to said shielding column;

providing a variable voltage divider to adjust said control electro-emission driver to vary the amplitude of the sine wave of an alternating current.

10. The method of claim 9 wherein a distorted image is caused by SEM sensitivity to external magnetic fields.

11. The method of claim 10 wherein external magnetic fields are produced by A/C powered equipment operating proximal said SEM.

12. The method of claim 9 wherein said control electro-emission driver further comprising a transformer with a variable resistor for adjusting an input alternating current to an adjusted output alternating current.

13. The method of claim 12 wherein said output alternating current having an adjusted amplitude of the sine wave is fed into said shielding column.

14. The method of claim 12 wherein said adjusted output alternating current has a frequency of 50 Hz.

15. The method of claim 13 wherein feeding said shielding column with a known A/C component corrects image distortions caused by said external electro-magnetic emissions.

16. The apparatus of claim 9 wherein said shielding column is a shield barrier composed of a nickel-iron alloy material which has extremely high magnetic permeability at low field strengths.

* * * * *